United States Patent
Voldman

(10) Patent No.: US 6,465,870 B2
(45) Date of Patent: Oct. 15, 2002

(54) ESD ROBUST SILICON GERMANIUM TRANSISTOR WITH EMITTER NP-BLOCK MASK EXTRINSIC BASE BALLASTING RESISTOR WITH DOPED FACET REGION

(75) Inventor: Steven Howard Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/769,667

(22) Filed: Jan. 25, 2001

(65) Prior Publication Data

US 2002/0096742 A1 Jul. 25, 2002

(51) Int. Cl.⁷ .................. H01L 27/082; H01L 27/102; H01L 29/70; H01L 31/11
(52) U.S. Cl. .................. 257/565; 257/47; 257/197; 257/273
(58) Field of Search .................. 257/47, 197, 273, 257/350, 543, 554, 556, 557, 575, 592

(56) References Cited

U.S. PATENT DOCUMENTS

| | | | | |
|---|---|---|---|---|
| 5,347,156 A | * | 9/1994 | Sakaue | 257/575 |
| 5,360,986 A | * | 11/1994 | Candelaria | 257/183 |
| 5,386,140 A | * | 1/1995 | Matthews | 257/592 |
| 5,406,111 A | | 4/1995 | Sun | |
| 5,465,006 A | * | 11/1995 | Chen | 257/557 |
| 5,592,017 A | * | 1/1997 | Johnson | 257/554 |
| 5,629,544 A | | 5/1997 | Voldman et al. | |
| 5,767,552 A | * | 6/1998 | Casper et al. | 257/379 |
| 5,773,350 A | * | 6/1998 | Herbert et al. | 438/364 |
| 5,891,792 A | * | 4/1999 | Shih et al. | 138/525 |
| 5,949,128 A | * | 9/1999 | Shibib | 257/565 |
| 6,013,941 A | * | 1/2000 | Shimizu | 257/565 |
| 6,034,388 A | | 3/2000 | Brown et al. | |
| 6,049,119 A | * | 4/2000 | Smith | 257/575 |

OTHER PUBLICATIONS

Voldman, S., et al., "Electrostatic Discharge and High Current Pulse Characterization of Epitaxial–Base silicon–Germanium Heterojunction Bipolar Transistors", 2000 IEEE International Reliability Physics Symposium Proceedings, 38th Annual (Cat. No. 00CH37059), pp. 310–316 (2000).

* cited by examiner

Primary Examiner—Carl Whitehead, Jr.
Assistant Examiner—Monica Lewis
(74) Attorney, Agent, or Firm—Scully, Scott, Murphy & Presser; Mark F. Chadurjian

(57) ABSTRACT

A ESD (electrostatic discharge) robust SiGe bipolar transistor is provided which comprises a substrate of a first conductivity type; a doped subcollector region of a second conductivity type formed on the substrate, the doped subcollector region including an epitaxial collector region which is defined between isolation trench regions; a first film comprising silicon and germanium formed on the doped subcollector region, the first film including a single crystal SiGe intrinsic base region and an extrinsic SiGe polysilicon base regions of the first conductivity type abutting the intrinsic base region; a second film comprising an emitter of the second conductivity type contained over the intrinsic base region formed by an emitter window mask and a second region formed outside of the emitter; a first doped region of the first conductivity type formed at a facet point between the intrinsic base region and one of the extrinsic base regions; a second doped region of said first conductivity type contained at the outermost extrinsic base regions; and a resistor formed in SiGe polysilicon base regions between said first and second doped regions.

8 Claims, 9 Drawing Sheets

ESD ROBUST SILICON GERMANIUM TRANSISTOR WITH EMITTER NP-BLOCK MASK EXTRINSIC BASE BALLASTING RESISTOR WITH DOPED FACET REGION

FIELD OF THE INVENTION

The present invention relates to a bipolar transistor, and more particularly to a silicon germanium (SiGe) bipolar transistor which includes an integrated resistor element for providing electrostatic discharge (ESD) robustness in radio frequency (RF) applications.

BACKGROUND OF THE INVENTION

Significant growth in both high-frequency wired and wireless markets has introduced new opportunities where compound semiconductors have unique advantages over bulk complementary metal oxide semiconductor (CMOS) technology. With the rapid advancement of epitaxial-layer pseudomorphic SiGe deposition processes, epitaxial-base SiGe heterojunction bipolar transistors have been integrated with mainstream advanced CMOS development for wide market acceptance, providing the advantages of SiGe technology for analog and RF circuitry while maintaining the full utilization of the advanced CMOS technology base for digital logic circuitry.

SiGe heterojunction bipolar transistor devices are replacing silicon bipolar junction devices as the primary element in all analog applications. With the increased volume and growth in the applications that use SiGe heterojunction bipolar transistors for external circuitry, electrostatic discharge (ESD) robustness is needed. This is especially the case in RF applications such as in mobile phone use, where high-transistor speeds and high-frequency responses are needed. As the frequency response of such devices increases, the loading effect on the transistor, which may lead to excessive noise and distortion, also increases.

To date, no SiGe bipolar transistors for use in RF applications and other applications which require high-operating speeds and high-frequencies have been developed in which substantial ESD robustness is provided. In view of this, there is a need to develop a SiGe bipolar transistor for use in applications in which substantial ESD robustness is provided.

SUMMARY OF THE INVENTION

The present invention uses some of the intrinsic base regions of the bipolar transistor as series base resistor ballasting elements, where the extrinsic base region is extended and dopants are blocked using an emitter mask level, and by providing a heavily-doped facet region which adjoins the SiGe epitaxially grown layer so as to avoid defect leakage into the intrinsic base region.

The term "facet region" is used herein to denote the boundary region wherein the SiGe layer changes from polycrystalline to single crystal. Typically, in the present invention, the polycrystalline SiGe is located above the isolation trenches, whereas the single crystal SiGe region lays above the epitaxial base collector region. In accordance with the above discussion, the facet region is located in regions next to the isolation regions.

In this invention, the term "SiGe" transistor also includes SiGe layers that include carbon, C, which is typically present inside the base region forming a SiGeC compound.

Specifically, in accordance with one aspect of the present invention, a SiGe bipolar transistor is provided which comprises:

a substrate of a first conductivity type;

a doped subcollector region of a second conductivity type formed on said substrate, said doped subcollector region including an epitaxial collector region which is defined between isolation regions;

a first film comprising silicon and germanium formed on said doped subcollector region, said first film including a single crystal SiGe intrinsic base region and extrinsic SiGe polysilicon base regions of said first conductivity type abutting said intrinsic base region;

a second film comprising an emitter of the second conductivity type contained over said intrinsic base region formed by an emitter window mask and a second region formed outside of the emitter;

a first doped region of the first conductivity type formed at a facet point between said intrinsic base region and one of said extrinsic base regions;

a second doped region of said first conductivity type contained at the outermost extrinsic base regions, said second doped region forming a base input; and a resistor formed in SiGe polysilicon base regions between said first and second doped regions, said resistor including a SiGe film.

The bipolar transistor of the present invention may also include a collector contact which is in contact with an exposed portion of said subcollector region, a base contact which is in contact with said input region and a emitter contact which is in contact with said emitter.

In accordance with another aspect of the present invention, a method of forming the above mentioned SiGe bipolar transistor is also provided. Specifically, the inventive method comprises the steps of:

(a) forming a SiGe-containing film on a surface of a structure which includes a subcollector region, said SiGe-containing film being formed by a low temperature deposition process;

(b) forming an insulator film on said SiGe-containing film;

(c) etching portions of said insulator film so as to expose portions of said SiGe-containing layer, while leaving other portions of said insulator film unetched;

(d) providing an emitter window opening in at least one of the unetched regions;

(e) forming an intrinsic polysilicon layer over the etched and unetched regions;

(f) patterning said intrinsic polysilicon layer using an emitter window etch mask so as to define spaces in said intrinsic polysilicon layer for forming extrinsic base regions;

(g) implanting a dopant in said spaces using said emitter window emitter etch mask as an implantation mask so as to form said extrinsic base regions in said SiGe-containing film; and (h) removing said emitter window mask.

In one embodiment of the present invention, silicide regions are formed on the extrinsic base regions prior to removing the emitter window mask. This is achieved utilizing conventional silicidation processes well known in the art, i.e., depositing a refractory metal layer on said extrinsic base regions; annealing the refractory metal layer so as to form a metallic silicide on said extrinsic base regions; and removing any metal not silicided in the annealing step. Alternatively, it is possible to block the facet region so that no silicide is formed therein.

In another embodiment of the present invention, contact regions to the collector, base and emitter are formed after the emitter window mask has been removed from the structure. The contact regions are formed by first depositing a dielectric material; providing contact openings in the dielectric material so as to expose the collector, base and emiter regions; depositing a conductive material in said contact openings, and, if needed, planarizing the structure.

DETAILED DESCRIPTION OF THE INVENTION

Figure 1:
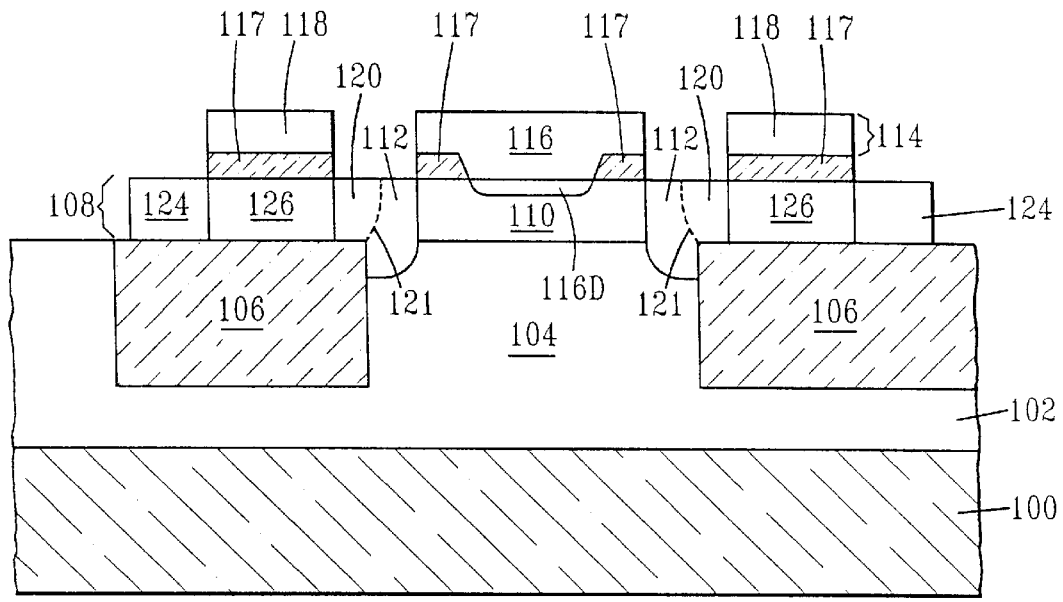
FIG. 1 is a pictorial representation of the inventive ESD robust SiGe bipolar transistor.

The present invention which is directed to an ESD robust SiGe bipolar transistor and a method of fabricating the same will now be described in greater detail by referring to the drawings that accompany the present application.

Reference is first made to FIG. 1 which is a pictorial representation of the inventive ESD robust SiGe bipolar transistor of the present invention. Specifically, the inventive ESD robust bipolar transistor comprises substrate 100 of a first conductivity type (e.g., P or N type), a subcollector region 102 of a second conductivity type that is different from the first conductivity type formed on substrate 100, and an epitaxial collector region 104 which is defined between isolation regions 106. Isolation regions 106 include shallow isolation trench (STI) regions, LOCOS (localized oxidation of silicon) regions, or any other well known isolation region. The subcollector can be defined by deep trench isolation, and it may contain reach through implants as well as pedestal implants, which implants are not shown in the drawings of the present invention.

It is noted that epitaxial collector region 104 is the region of the device in which the emitter will be formed thereon. It is also noted that carbon can exist under region 106 and in region 102 to reduce mechanical stress and dislocations. In the drawings, the region extending from emitter 116 into intrinsic base 110 is emitter diffusion 116D.

The inventive SiGe bipolar transistor also includes a first film 108 comprising silicon and germanium formed on a surface of subcollector 102. As shown in FIG. 1, the first film overlays the isolation regions and the epitaxial collector region of the subcollector. The first film includes a single crystal SiGe intrinsic base region 110 formed on said epitaxial collector region and extrinsic SiGe polysilicon base regions 112 of the first conductivity type abutting region 110.

Second film 114, which includes emitter polysilicon 116 of the second conductivity type contained over the intrinsic base region and a second region 118 present adjacent to emitter polysilicon 116, is formed on the first film. In accordance with the present invention, an insulator 117 comprising an oxide, nitride or combination thereof is typically present between the first and second films except for the emitter region wherein insulator 117 has been etched to formed an emitter window region in the insulator.

The inventive structure shown in FIG. 1 also includes a first doped region 120 of the first conductivity type formed at facet point 121 between intrinsic base region 110 and extrinsic SiGe polysilicon base regions 112; and a second doped region 124 of said first conductivity type contained at outermost extrinsic SiGe polysilicon base regions 112. In accordance with the present invention, second doped region 124 forms a base input of the structure.

The bipolar transistor of FIG. 1 also includes resistor 126 formed in the extrinsic SiGe polysilicon base region between the first and second doped regions. In accordance with the present invention, the resistor comprises a SiGe film.

Figure 2:
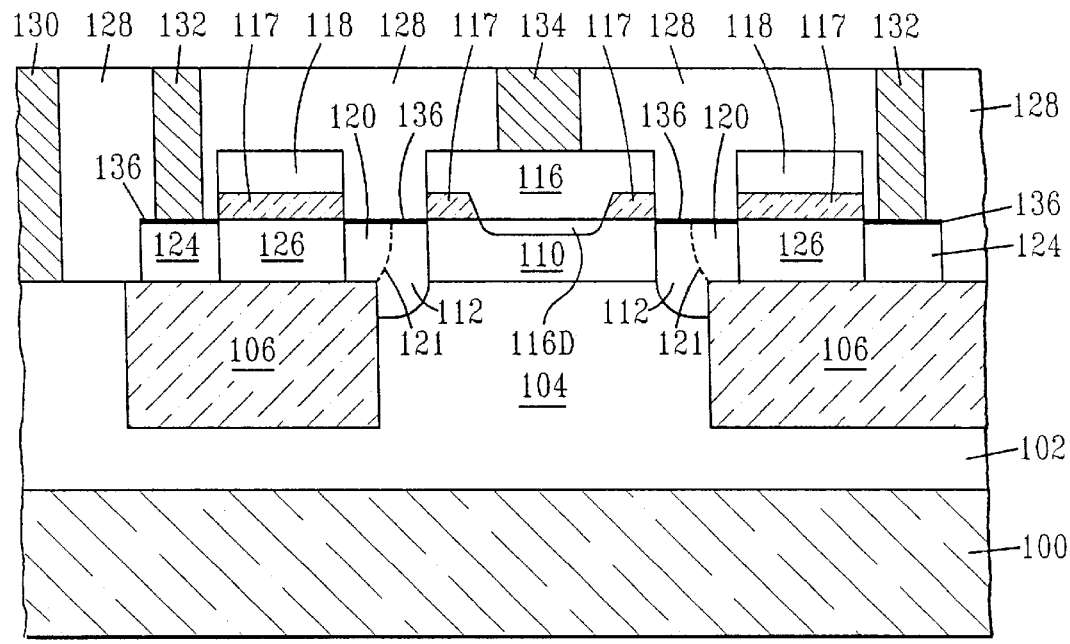
FIG. 2 is a pictorial representation of the inventive ESD robust SiGe bipolar transistor containing collector, base and emitter contacts.

FIG. 2 shows a pictorial representation of the ESD robust SiGe bipolar transistor of FIG. 1 after collector contact 130, base contact 132 and emitter contact 134 are formed. Contacts 134 can be placed over insulating regions 117 to provide emitter resistor ballasting. It should be also noted that multiple contacts can be formed on film 116. As illustrated, the various contact regions are formed in dielectric layer 128 which is deposited on the structure of FIG. 1. It should be noted that prior to forming the contact regions, portions of the bipolar transistor structure are subjected to a conventional silicidation process so as to form silicide regions 136 on the first film layer, i.e., over the first doped region and/or on said extrinsic SiGe polysilicon base region and said base input. In one embodiment, the regions over the facet region are not silicided. The silicide regions consist of a refractory metal such as Ti, TiN, TiMo, TiNb, or Co.

Figure 3:
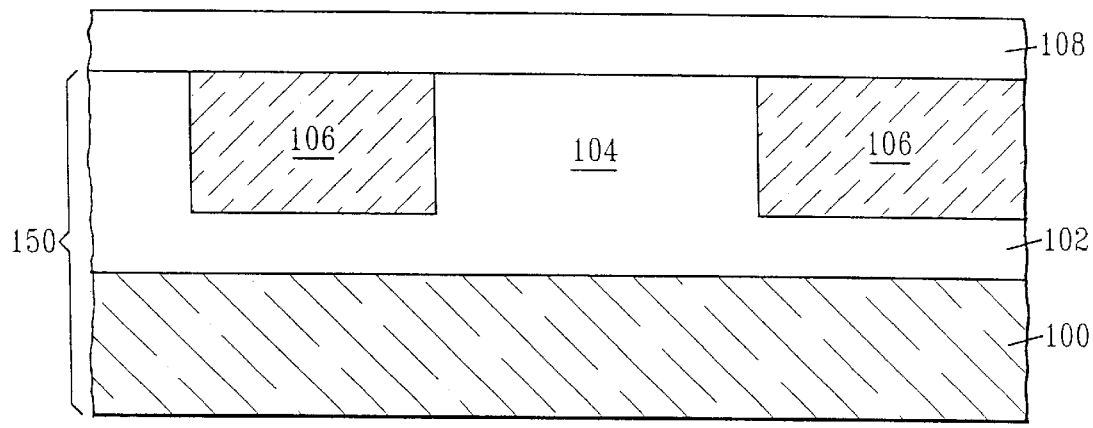
FIGS. 3–12 are pictorial representations through various processing steps of the present invention.

The method used in forming the inventive structure shown in FIG. 1 will now be described in more detail by referring to the discussion below as well as FIGS. 3–12. FIG. 3 shows SiGe-containing film 108 on a surface of a structure 150 which includes a subcollector region 102. The structure of FIG. 3 also includes substrate 100, epitaxial collector region 104, and isolation regions 106. In accordance with the present invention, substrate 100 is of a first conductivity type (N or P) and subcollector region 102 is of a second conductivity type (N or P) that is different from the conductivity type of the substrate.

Structure 150 is formed utilizing conventional process steps that are well known to those skilled in the art. Since the processing steps used in forming structure 150 are known, a detailed description of the same is not provided herein.

Insofar as SiGe-containing film 108 is concerned, that film layer is formed utilizing a low temperature (550° C. or below) deposition process. Suitable low temperature deposition processes that can be used in forming SiGe-containing film layer 108 include chemical vapor deposition (CVD), plasma-enhanced CVD, atomic layer deposition (ALD), chemical solution deposition, ultra-high vacuum CVD and other like deposition processes. It should be noted that the deposition process used in forming film 108 is capable of simultaneously depositing a single crystal epi-SiGe region and abutting SiGe polycrystalline regions.

Figure 4:
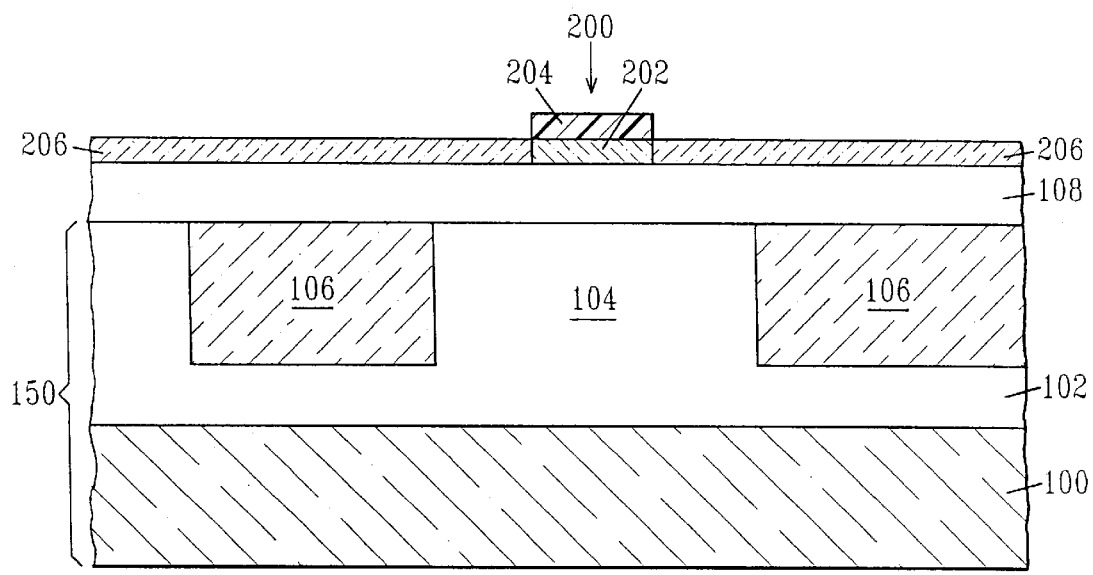
Figure 5:
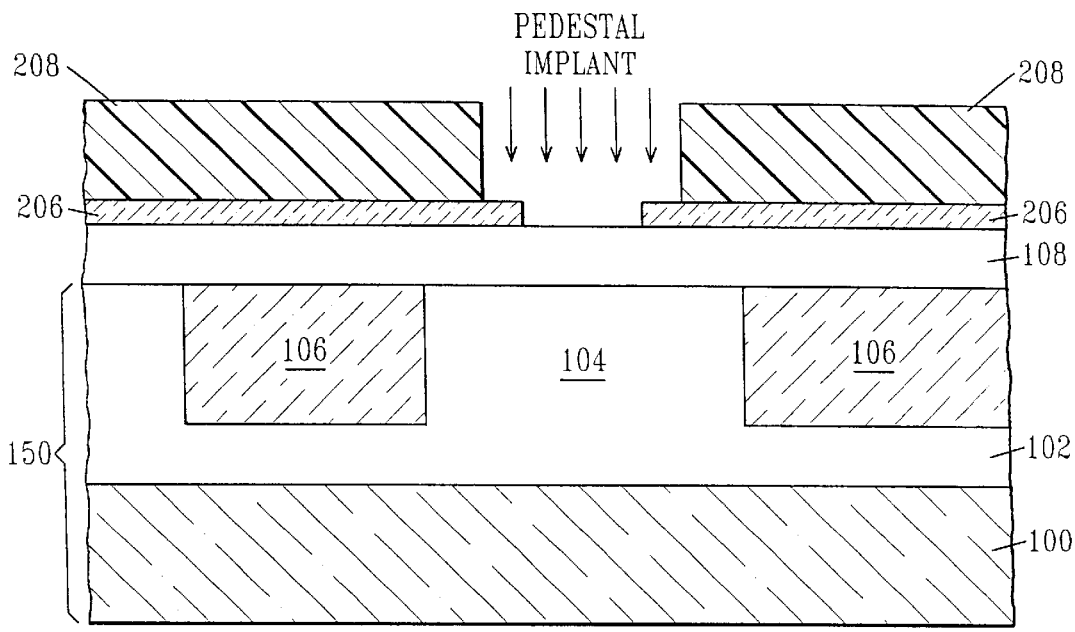

FIGS. 4–5 show the steps that are used in defining the emitter region and forming a pedestal implant in the surface of structure 150. The steps illustrated by these figures are conventional and include the formation of dummy emitter stack layer 200 which comprises oxide layer 202 and nitride layer 204 on the surface of SiGe layer 108. The dummy emitter stack is formed by successively depositing the oxide and nitride layers on the SiGe layer utilizing conventional deposition processes that are well known to those skilled in the art, e.g., CVD. Next, a photoresist, not shown, is applied to nitride layer 204, and the photoresist is thereafter patterned by conventional lithography. Next, the exposed layers of the dummy stack not containing the patterned photoresist is etched stopping on layer 108. Sacrificial oxide layer 206 is then formed by conventional means over the SiGe layer abutting the dummy emitter stack. The photoresist used in defining the dummy emitter stack is removed by a conventional stripping process and etching is then performed to remove the dummy emitter stack exposing a portion of SiGe layer 108. Patterned resist 208 is formed on portions of the sacrificial oxide layer and a pedestal implant is then performed utilizing a conventional ion implantation process well known to those skilled in the art. The resist and sacrificial oxide layer are thereafter removed.

Figure 6:
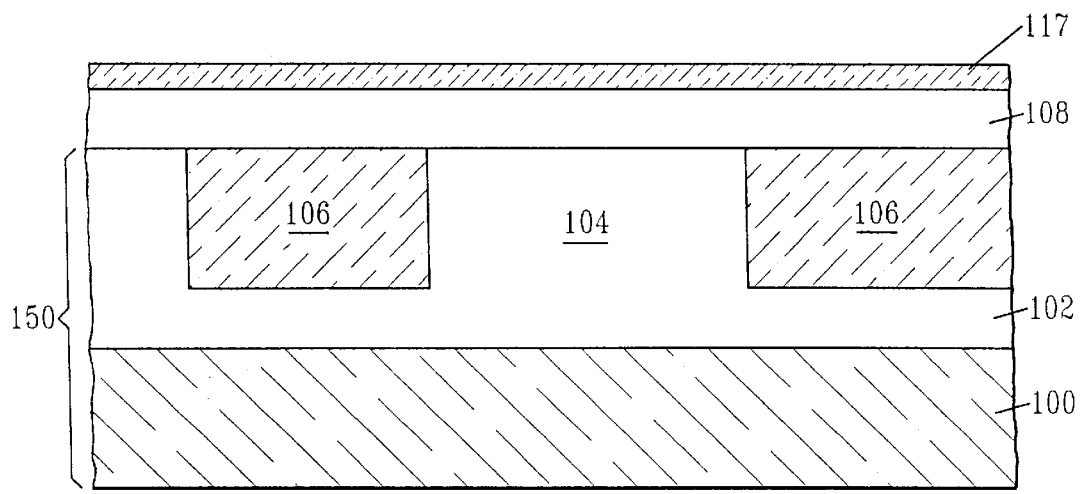

Next, and as is illustrated in FIG. 6, insulator 117 is formed on the surface of SiGe film layer 108 utilizing conventional deposition processes well known in the art. Suitable deposition process include, but are not limited to: CVD, plasma-enhanced CVD, sputtering, chemical solution deposition and other like deposition processes. Insulator 117 may comprise a single insulator material, or it may include combinations of more than one insulator material, e.g., a dielectric stack. The insulator used in this step of the present invention thus may comprise an oxide, a nitride or a combination thereof.

Figure 7:
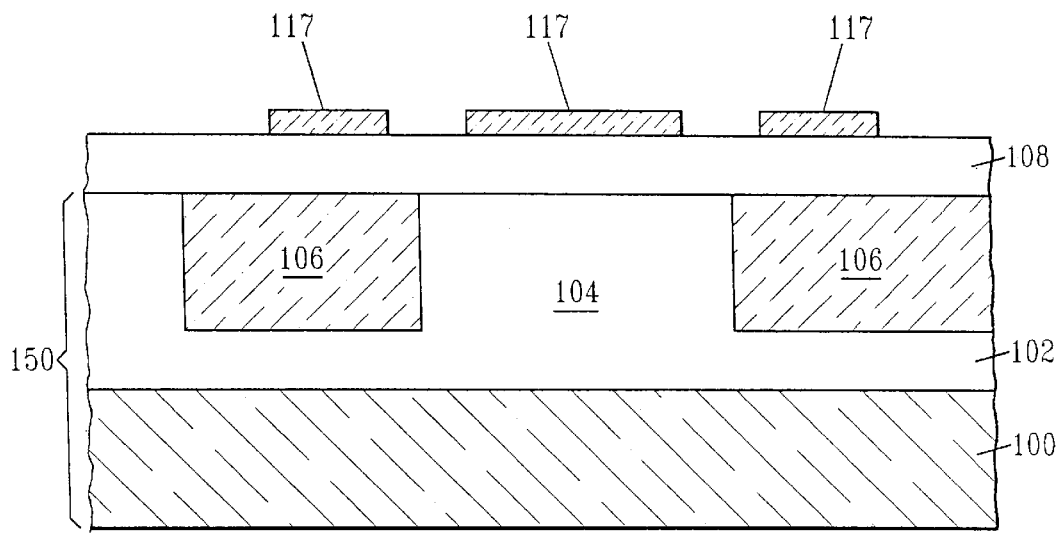

The structure shown in FIG. 6 is then etched to provide the structure shown in FIG. 7. Specifically, the structure shown in FIG. 7 is formed by selectively etching portions of insulator film 117 so as to expose portions of SiGe-containing layer 108, while leaving other portions of said insulator film unetched. This selective etching step is carried out utilizing conventional lithography and etching such as reactive ion etching (RIE). This selective etch defines regions for forming emitter region 116 and regions for forming the resistor element.

Figure 8:
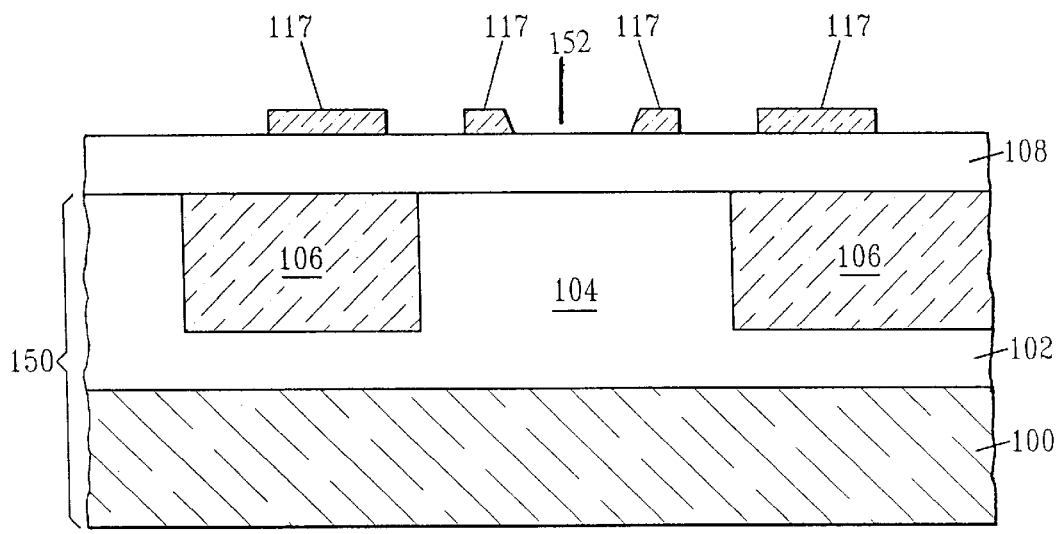

FIG. 8 shows the structure after emitter window opening 152 is formed in at least one of the unetched regions. The emitter opening is formed utilizing conventional lithography and etching such as RIE. It should be noted that the emitter opening is formed above overlaying epitaxial collector region 104.

Figure 9:
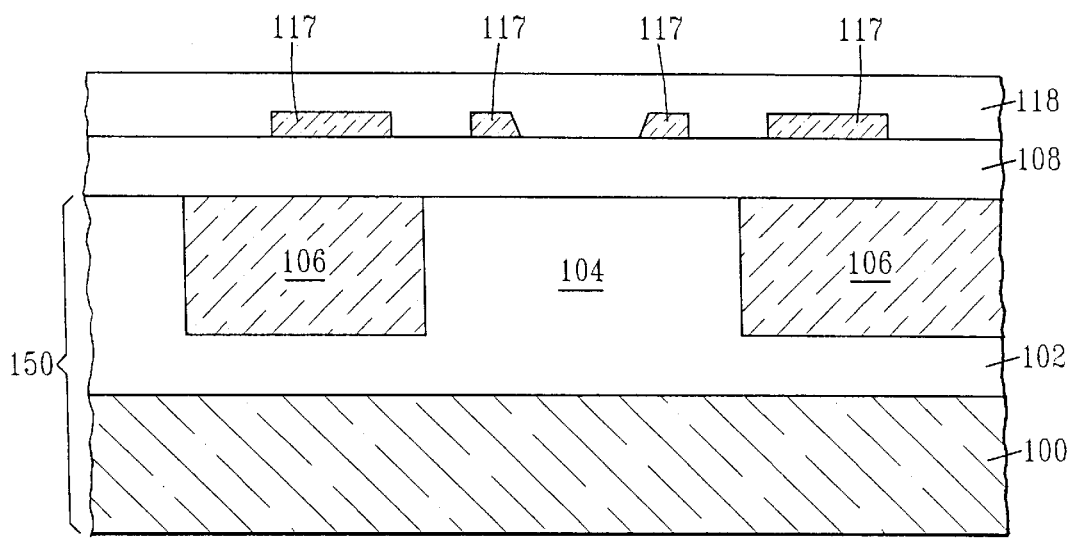

FIG. 9 shows the structure after a layer of intrinsic polysilicon 114 is formed over the etched and unetched regions. The intrinsic polysilicon layer is formed utilizing any conventional in-situ doping deposition process that is well known in the art.

Figure 10:
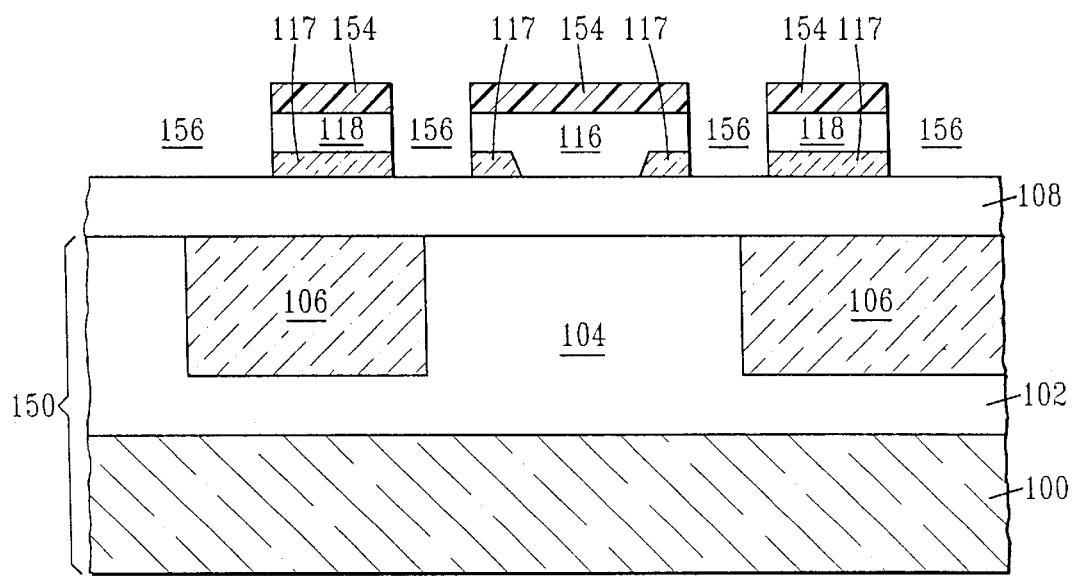

In FIG. 10, the intrinsic polysilicon layer is patterned using an emitter window etch mask 154 so as to define spaces 156 in polysilicon layer for forming extrinsic base regions. To define these spaces, conventional lithography and etching are again employed.

Figure 11:
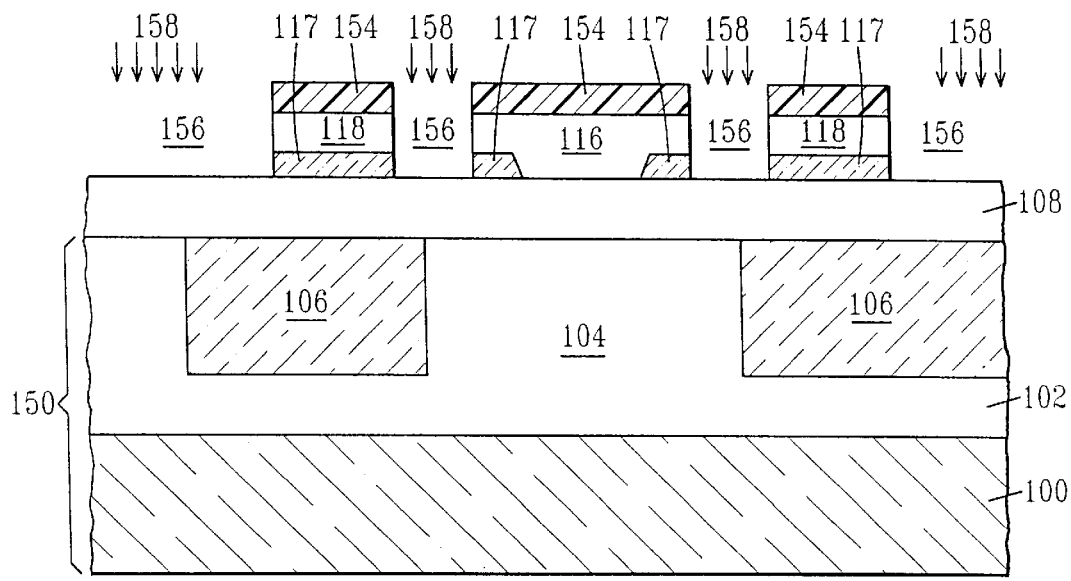

FIG. 11 illustrates the step of implanting a dopant 158 in spaces 156 using emitter window emitter etch mask 154 as an implantation mask so as to form the extrinsic base regions in said SiGe-containing film. The dopant used during this step of the present invention should be the same as the dopant present in substrate 100.

Figure 12:
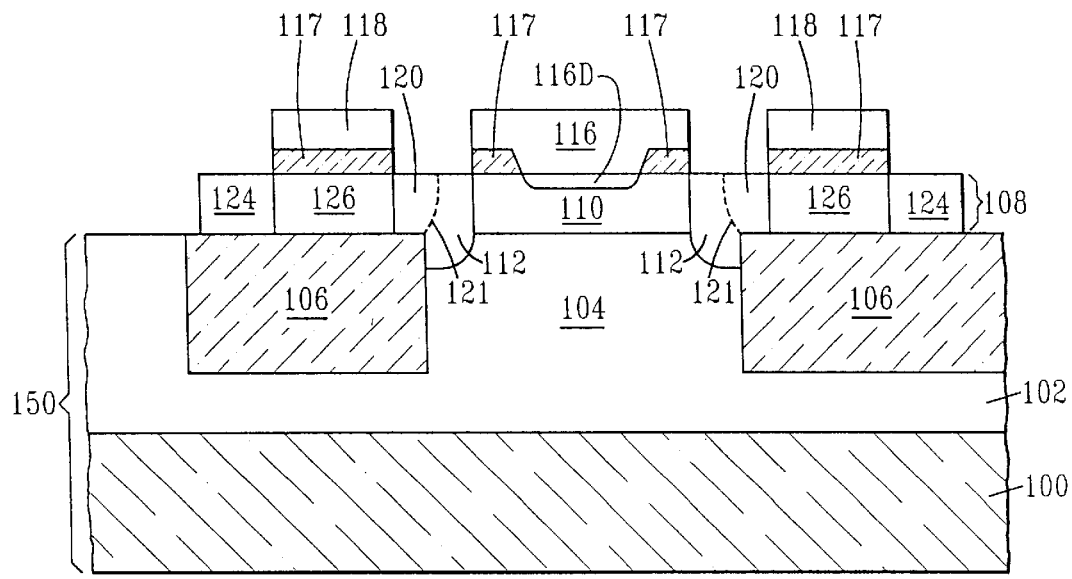

FIG. 12 which includes emitter diffusion 116D shows the structure after the emitter window mask has been removed from the structure utilizing conventional stripping processes well known to those skilled in the art. It should be noted that prior to stripping the emitter window mask a portion of the base SiGe layer is removed.

It should be noted that the above processing steps describe the basic steps that are employed in the present invention in forming the structure shown in FIG. 1. Other conventional processing steps that are employed in forming bipolar transistors can also be used in conjunction with the processing steps mentioned above.

Figure 13:
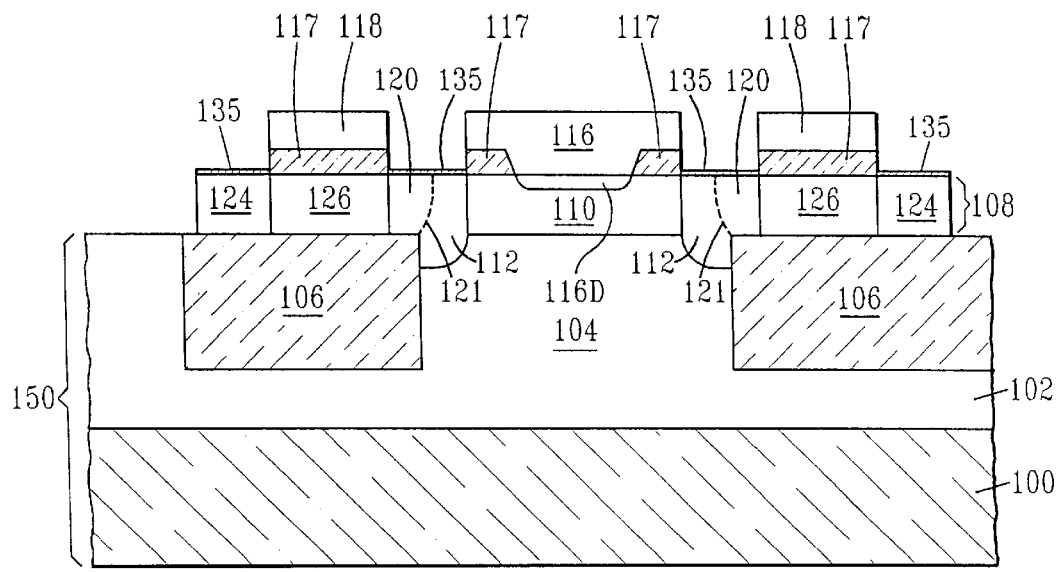
FIG. 13–14 are pictorial representations of the steps used in forming silicide regions in the extrinsic base regions.
Figure 14:
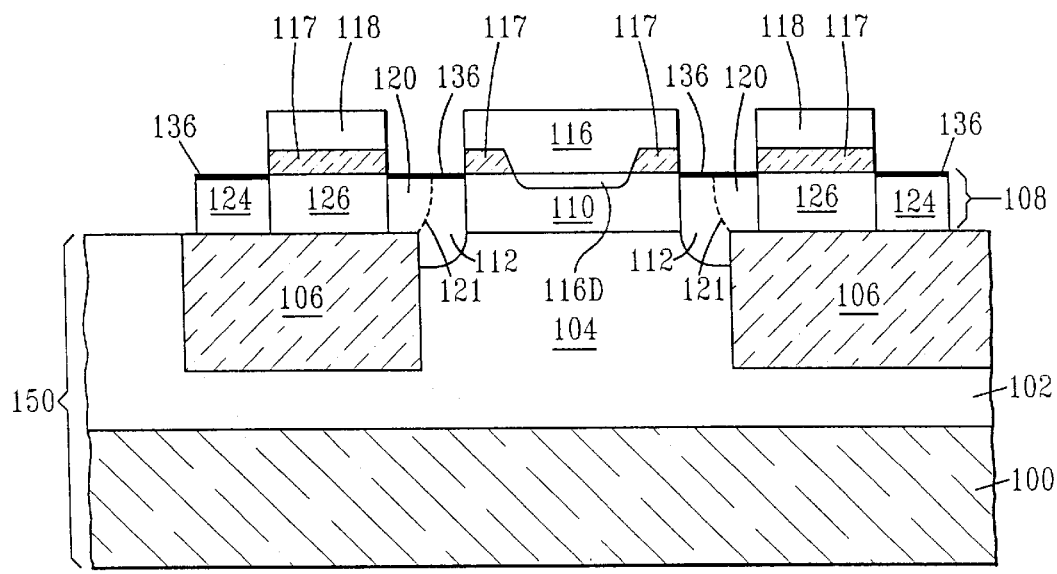

In one embodiment of the present invention, silicide regions are formed on the extrinsic base regions prior to removing the emitter window mask. This is achieved utilizing conventional silicidation processes well known in the art, including deposition of refractory metal layer 135 on said extrinsic base regions, See, FIG. 13; annealing the metal layer so as to form metallic silicide regions 136, See FIG. 14, on said extrinsic base regions; and removing any refractory metal not silicided in the annealing step. Examples of refractory metals include, but are not limited to: Ti, TiN, TiMo, TiNo and Co.

In an alternative embodiment, no silicide regions are formed over the facet region in the structure. This is accomplished by forming a blocking mask over those regions prior to silicidation.

Figure 15:
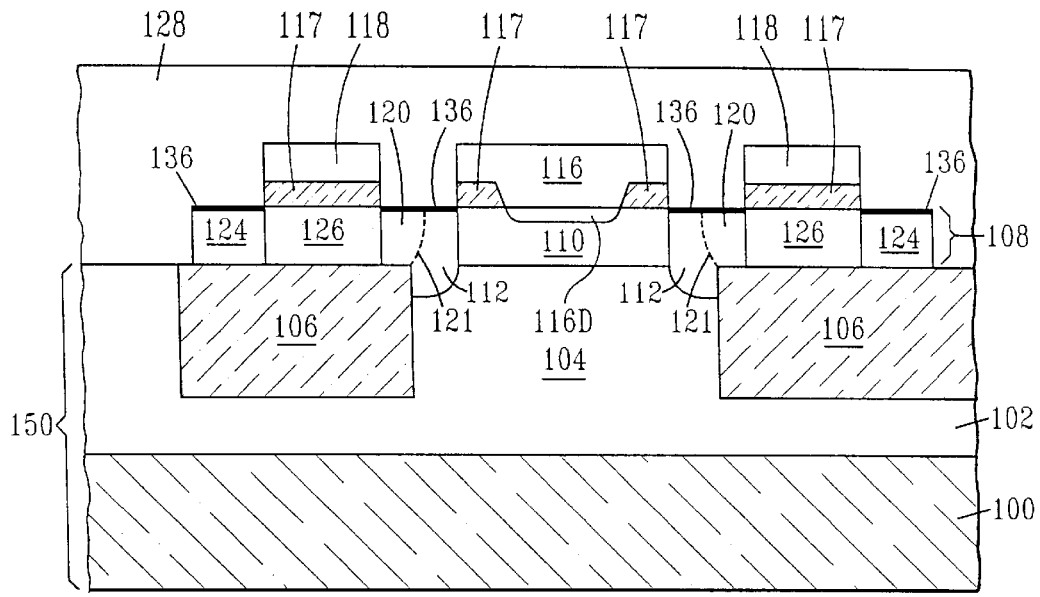
FIGS. 15–17 are pictorial representations of the steps used in forming contact regions in the structure.
Figure 16:
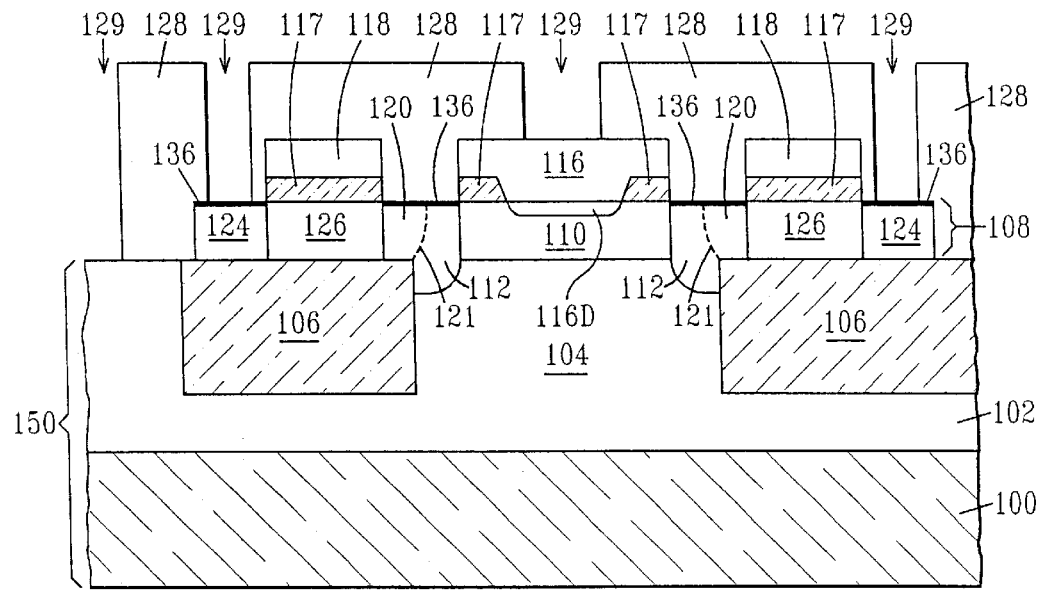
Figure 17:
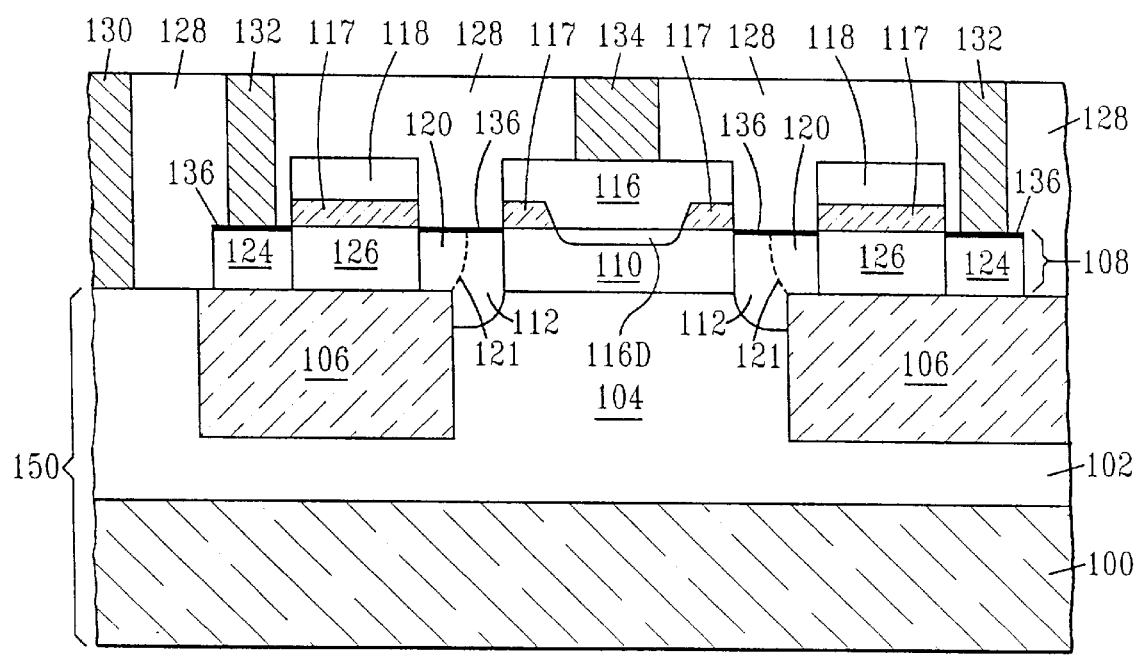

In another embodiment of the present invention, contact regions to the collector, base and emitter are formed after the emitter window mask has been removed from the structure, See FIGS. 15–17. The contact regions are formed by first depositing dielectric material 128, See FIG. 15, utilizing a conventional deposition process. The dielectric material may be any conventional inorganic dielectric material (e.g., $SiO_2$, $Si_3N_4$, $Al_2O_3$, and perovskite-type oxides) or organic dielectric material (e.g., polyimides and Si-containing polymers). Contact openings 129 are then formed by conventional lithography and etching in the dielectric material so as to expose the collector, base and emitter regions, See FIG. 16; and thereafter a conductive material which becomes the contact such as a conductive metal or oxide is deposited by conventional deposition techniques in the contact openings providing the structure shown in FIG. 17. If needed, the structure may be subjected to a conventional planarization process such as chemical-mechanical polishing (CMP) or grinding.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described my invention in detail, what I claim is new and desire to secure by the Letters Patent is:

1. A SiGe bipolar transistor comprising:

a substrate of a first conductivity type;

a doped subcollector region of a second conductivity type atop said substrate, said doped subcollector region including an epitaxial collector region which is defined between isolation regions;

a first film comprising silicon and germanium located above said doped subcollector region, said first film including a single crystal SiGe intrinsic base region and extrinsic SiGe polysilicon base regions of said first conductivity type abutting said intrinsic base region;

a second film comprising an emitter of the second conductivity type contained over said intrinsic base region formed by an emitter window mask and a second region formed outside of the emitter;

a first doped region of the first conductivity type located at a facet point between said intrinsic base region and one of said extrinsic base regions;

a second doped region of said first conductivity type contained at the outermost extrinsic base regions; said second doped region forming a base input; and a resistor located in the extrinsic SiGe polysilicon base regions between said first and second doped regions, said resistor including SiGe film.

2. The SiGe bipolar transistor of claim 1 further comprising silicide regions formed on said first doped region.

3. The SiGe bipolar transistor of claim 1 further comprising silicide regions formed on said extrinsic SiGe polysilicon base regions and said base input.

4. The SiGe bipolar transistor of claim 1 further comprising a collector contact formed in contact with an exposed portion of said doped subcollector region.

5. The SiGe bipolar transistor of claim 1 further comprising a base contact in contact with said extrinsic SiGe polysilicon base region.

6. The SiGe bipolar transistor of claim 1 further comprising an emitter contact in contact with said emitter.

7. The SiGe bipolar transistor of claim 1 wherein said first conductivity type is P-type and said second conductivity type is N-type.

8. The SiGe bipolar transistor of claim 1 further comprising C within said SiGe film forming a SiGeC film.

* * * * *